United States Patent
Yan et al.

(10) Patent No.: US 8,203,370 B2
(45) Date of Patent: Jun. 19, 2012

(54) SCHMITT TRIGGER WITH GATED TRANSITION LEVEL CONTROL

(75) Inventors: Shouli Yan, Austin, TX (US); Zhiwei Dong, Austin, TX (US); Axel Thomsen, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 177 days.

(21) Appl. No.: 12/494,621

(22) Filed: Jun. 30, 2009

(65) Prior Publication Data

US 2010/0327930 A1    Dec. 30, 2010

(51) Int. Cl.
*H03K 3/00* (2006.01)
(52) U.S. Cl. .......................... 327/206; 327/205
(58) Field of Classification Search .................. 327/205, 327/206; 330/252–261
See application file for complete search history.

(56) References Cited

U.S. PATENT DOCUMENTS

| | | |
|---|---|---|
| 5,155,386 A | 10/1992 | Abdi |
| 5,313,114 A | 5/1994 | Poletto et al. |
| 5,446,396 A | 8/1995 | Brehmer |
| 5,798,663 A | 8/1998 | Fugere et al. |
| 6,249,162 B1 | 6/2001 | Inoue |
| 6,957,278 B1 | 10/2005 | Gallagher et al. |
| 7,268,593 B1 * | 9/2007 | Doyle et al. ................. 327/77 |
| 7,292,083 B1 | 11/2007 | Wang et al. |
| 7,307,476 B2 | 12/2007 | Sheng et al. |
| 7,777,537 B2 * | 8/2010 | Demolli et al. ............. 327/143 |
| 2005/0162207 A1 | 7/2005 | Kamei |
| 2005/0238119 A1 | 10/2005 | Zhu et al. |

\* cited by examiner

*Primary Examiner* — Lincoln Donovan
*Assistant Examiner* — Diana J Cheng
(74) *Attorney, Agent, or Firm* — Trop, Pruner & Hu, P.C.

(57) ABSTRACT

A Schmitt trigger comprises first and second circuitry. The first circuitry receives an input voltage and provides an output voltage at either a logical "low" or a logical "high" voltage level responsive to the input voltage and a first bias voltage. The second circuitry connects to the first circuitry to generate a second bias current for generating the output voltage. The second bias current is larger than the first bias current. The Schmitt trigger operates in a low power mode of operation using only the first bias voltage to maintain the logical "low" voltage level or the logical "high" voltage level at a substantially constant level. In a high power mode of operation the Schmitt trigger uses the second bias voltage during transition periods between the logical "low" voltage level and the logical "high" voltage level.

22 Claims, 4 Drawing Sheets

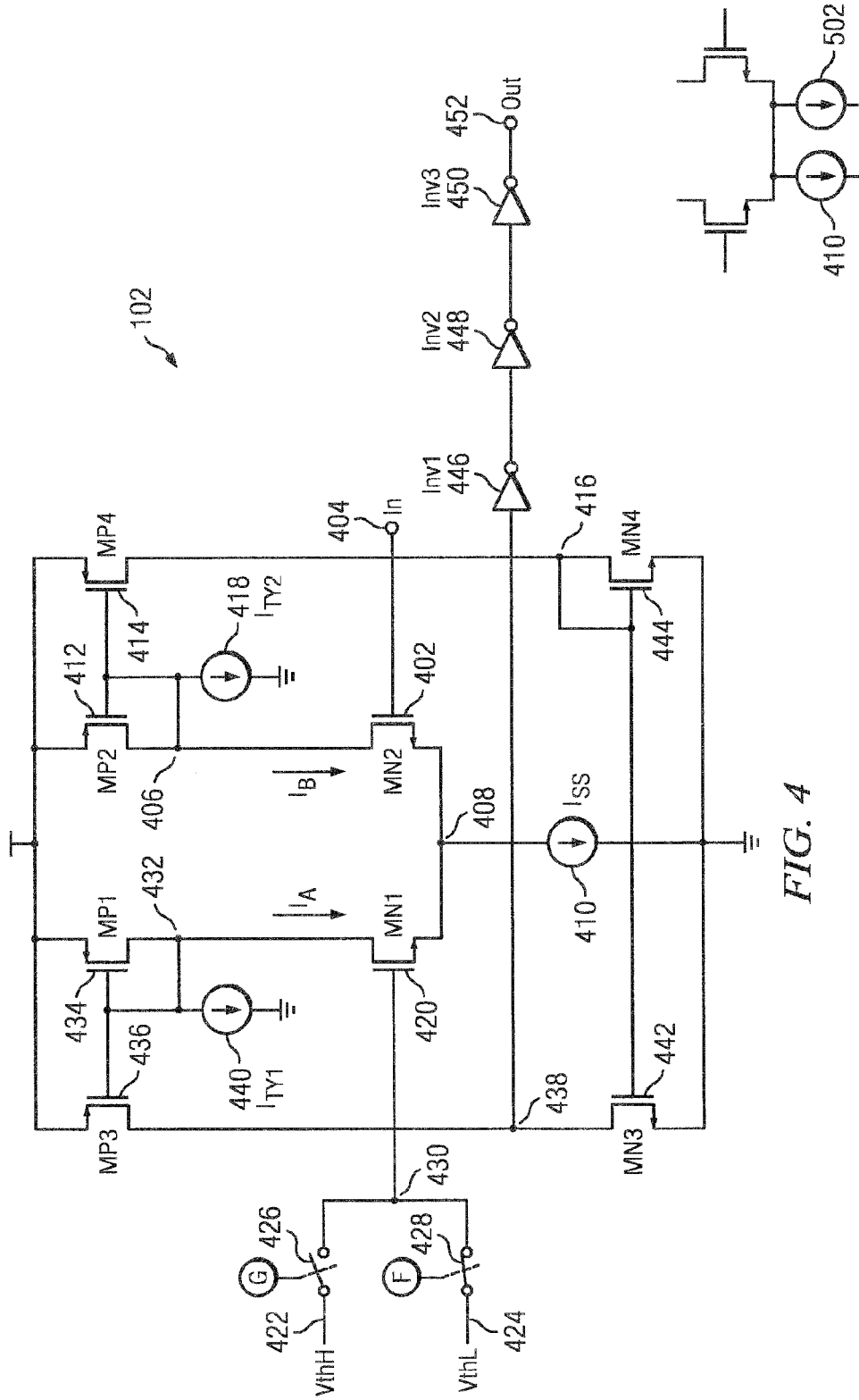
FIG. 4
FIG. 5

SCHMITT TRIGGER WITH GATED TRANSITION LEVEL CONTROL

CROSS-REFERENCE TO RELATED APPLICATIONS n/a

TECHNICAL FIELD

The present invention relates to Schmitt triggers, and more particularly to a Schmitt trigger having gated transition level control.

BACKGROUND

A Schmitt trigger is a circuit for controlling hysteresis on a digital input of digital circuitry. Within a Schmitt trigger, when the input value is higher than a certain chosen threshold, the output of the Schmitt trigger goes high. Similarly, when the input is below a second lower threshold level, the output goes to a logical "low" level. When the input remains between the high and low threshold levels, the output retains its current value. A Schmitt trigger provides greater stability than a circuit input including only a single input threshold level. With single input threshold level circuits, a noisy input signal near the threshold level could cause the output to switch rapidly back and forth from noise within the signal alone. A noisy Schmitt trigger input signal near one threshold can only cause one switch in output value after which it would have to move beyond the other threshold in order to cause another transition.

Various types of digital circuits such as isolators or isolation drivers demand fast Schmitt triggers with low pulse width distortion (PWD), short delay, low power dissipation and tightly controlled hysteresis transition levels. Traditional Schmitt triggers cannot meet all of these requirements at the same time. Traditional Schmitt triggers are either slow, introduce relatively large PWD, do not have a well controlled hysteresis level or consume relatively high power. Thus, there is a need for a Schmitt trigger that overcomes these problems within a single design and can be used in applications that demand low power, high speed, small PWD and accurately defined hysteresis transition levels.

SUMMARY

The present invention, as disclosed and described herein, comprises a Schmitt trigger including first and second circuitry. The first circuitry receives an input voltage and provides an output voltage at either a logical "low" voltage level or a logical "high" voltage level responsive to the input voltage and a first bias voltage. Second circuitry connects to the first circuitry for generating a second bias current wherein the second bias current is larger than the first bias current during transition periods of the input. The Schmitt trigger operates in a low power mode of operation using only the first bias voltage to maintain the logical "low" voltage level or the logical "high" voltage level at a substantially constant level. The Schmitt trigger also operates in a high power mode of operation using the second bias voltage during transition periods between the logical "low" voltage level and the logical "high" voltage level.

BRIEF DESCRIPTION OF THE DRAWINGS

For a more complete understanding, reference is now made to the following description taken in conjunction with the accompanying Drawings in which:

FIG. 4 is a schematic diagram of a Schmitt trigger having accurately defined threshold voltages according to the present disclosure;

FIG. 5 is a schematic diagram illustrating the manner in which the operation of the Schmitt trigger may be accelerated;

DETAILED DESCRIPTION

Figure 1:
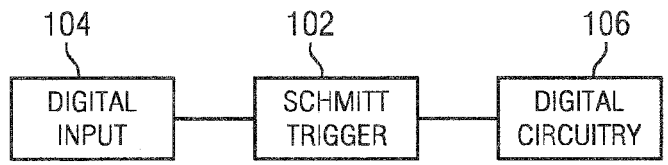
FIG. 1 is a block diagram of the operating environment of the Schmitt trigger of the present disclosure.

Referring now to the drawings, wherein like reference numbers are used herein to designate like elements throughout, the various views and embodiments of a Schmitt trigger with gated transition level control are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to the drawings, and more particularly to FIG. 1, there is illustrated a block diagram showing the placement of a Schmitt trigger within a digital circuit design. The Schmitt trigger 102 is located between some type of digital input 104 and digital circuitry 106 associated with the digital input. As described previously, the Schmitt trigger 102 is used over a circuit including only a single input threshold level in order to provide greater noise immunity. The dual threshold level associated with the Schmitt trigger 102 enables the input provided to digital input 104 to remain at a more stable level when it is input to the digital circuitry 106 and prevent undesirable switching within the digital signal applied to the digital circuitry 106 due to noise within the signal.

Figure 2:
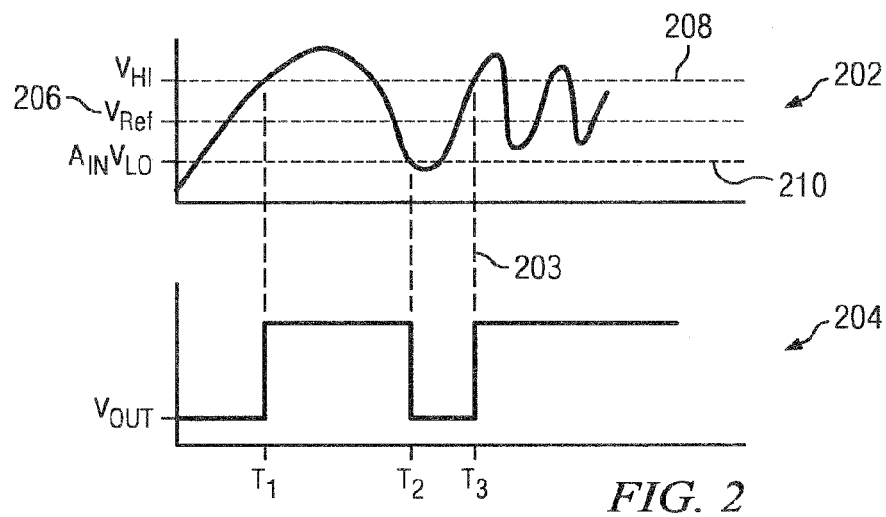
FIG. 2 illustrates the waveforms associated with the input and output of a Schmitt trigger.

Referring now also to FIG. 2, there is illustrated a first waveform 202 representing the input to the Schmitt trigger 102. As can be seen, the input waveform 202 comprises an analog signal that oscillates over a range of voltages. The reference voltage $V_{REF}$ 206 indicates the voltage level at which it is desirable for the Schmitt trigger 102 to switch its output from a logical "high" to a logical "low" level and vice versa. However, as described previously, noise within a signal at a level relatively close to the $V_{REF}$ voltage level 206 could cause undesirable switching of the output of the Schmitt trigger 102 from a logical "high" to a logical "low" level due not to an actual change in the state of the input but due to noise within the circuit being superimposed on the input.

In order to overcome this, a high voltage threshold level $V_{HIGH}$ 208 and a low voltage threshold level $V_{LOW}$ 210 are established. Responsive to the reference voltage level 206 and the high and low threshold levels 208 and 210, the output of the Schmitt trigger $V_{OUT}$ operates in the manner illustrated at diagram 204. At time $T_1$ when the output level is initially low, the output goes from a logical "low" to a logical "high" level responsive to the input waveform 202 exceeding the $V_{HIGH}$ threshold level 208. The output $V_{OUT}$ remains at the logical "high" level until time $T_2$ when the input voltage waveform 202 falls below the $V_{LOW}$ reference 210. It is noted that the output signal does not go low responsive to the input voltage waveform 202 falling below the $V_{REF}$ level 206 but does not go low until it falls below the $V_{LOW}$ threshold level 210. Similarly, the output voltage $V_{OUT}$ 204 will go back to the logical "high" level once the input voltage signal 202 again exceeds the high voltage threshold level 208. The increase to the logical "high" level is again associated with the $V_{HIGH}$ voltage level 208 rather than the $V_{REF}$ level 206. Past point 203 it can be seen that the input voltage waveform oscillates below the $V_{REF}$ voltage level 206 a number of times, however, the input voltage signal 202 never drops below the $V_{LOW}$ threshold 210 thus the output of the Schmitt trigger 102 remains at the logical "high" level.

Figure 3:
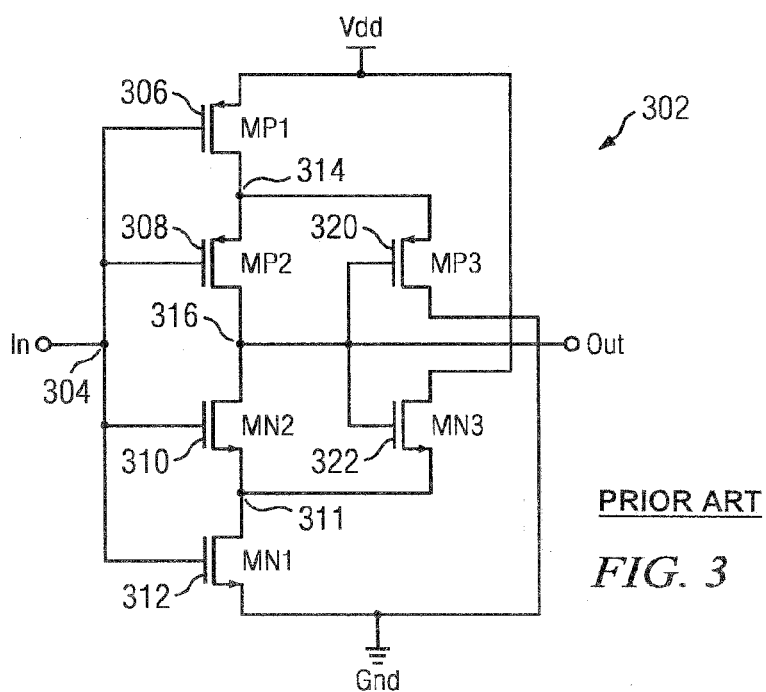
FIG. 3 is a schematic diagram of a prior art conventional CMOS Schmitt trigger.

Referring now to FIG. 3, there is illustrated a schematic diagram of a prior art conventional CMOS Schmitt trigger inverter 302. The input of the Schmitt trigger 302 is provided to node 304. Connected to the node 304 are the gates of two P-channel transistors 306 and 308 and two N-channel transistors 310 and 312. Transistor 306 has its source/drain path connected between the $V_{DD}$ node and node 314. Transistor 308 has its source/drain path connected between node 314 and node 316. Transistor 310 has its drain/source path connected between node 316 and node 318 and transistor 312 has its drain/source path connected between node 318 and ground. Transistor 320 has its gate connected to node 316 and its source/drain path connected between node 314 and the ground node. Transistor 322 has its gate connected to node 316 and its drain/source path connected between $V_{DD}$ and node 311. The output of the Schmitt trigger 302 is connected to node 316.

When the input voltage applied at node 304 is at a low level below the threshold voltage level $V_{LOW}$, the output of the Schmitt trigger 302 will be at a logical "high" level. When the input node 304 is at a logical "low" level, transistors 306 and 308 are turned on while transistors 310 and 312 are turned off pulling node 316 high. This causes transistor 322 to be turned on and transistor 320 to be turned off and provides a logical "high" output at node 316. This will result in transistor 322 pulling node 311 high, thus requiring the input voltage to be one $V_T$ above that voltage to turn on transistor 310.

When a logical "high" signal is provided at node 304, transistors 306 and 308 are turned off while transistor 310 and transistor 312 are turned on. The turning on of transistor 310 causes transistor 320 to be turned on which lowers the overall input threshold voltage by pulling node 314 low such that the transistor 308 will turn on only when the input voltage is one $V_T$ below node 314. One problem with this type of CMOS Schmitt trigger circuitry is that the threshold voltage across transistors 306, 308, 310 and 312 are not specifically known as they can change due to temperature and process variations. Moreover, the high and low input threshold voltages of the Schmitt trigger strongly depend on the supply voltage. This can cause the hysteresis level associated with the output signal from node 316 to change in accordance with these process, supply voltage and temperature variations. Since the transition levels of the conventional Schmitt triggers as illustrated in FIG. 3 suffer from large process, supply voltage and temperature variations there is a need to provide some manner for tightly controlling the transition threshold voltages that are required by the Schmitt trigger.

Referring now to FIG. 4, there is illustrated a Schmitt trigger having accurately defined threshold voltages. The circuit of FIG. 4 uses a differential pair amplifier as the input stage of the Schmitt trigger for accurately defining the threshold voltages. A first side of the differential amplifier includes transistor 402. The gate of transistor 402 is connected to receive the input voltage to the Schmitt trigger at node 404. The drain/source path of transistor 402 is connected between node 406 and node 408.

A current source 410 is connected between node 408 and ground. A transistor 412 has its source/drain path connected between the $V_{DD}$ node and node 406. The gate of transistor 412 is also connected to its drain at node 406 and to the gate of a transistor 414. Transistor 414 has its source/drain path connected between the $V_{DD}$ node and node 416. A current source 418 is connected between node 406 and ground. The other input of the differential amplifier is at the gate of a transistor 420. The gate of transistor 420 is connected to receive either a high voltage threshold voltage 422 or a low voltage threshold voltage 424. Threshold voltages VTH high and VTH low provided at 422 and 424, respectively, are provided by a bandgap reference voltage generator which is readily available on-chip within the integrated circuit and provides a stable temperature and process independent voltage(s). By using the threshold voltage levels applied from the bandgap reference voltage, the threshold levels will be insensitive to process, supply voltage and temperature variations. A 5 volt TTL level may be supported demanding 5 volt input devices. For optimal high speed operation, only the input pair of transistors 402 and 420 employ 5 volt devices and the remaining stages all use low voltage devices.

A pair of switches 426 and 428 are used to connect the desired one of the voltages to the other input of the differential amplifier at transistor 420 depending on whether the output is presently at a logical "low" or a logical "high" level. The switches 426 and 428 connect either the high threshold voltage or the low threshold voltage to the gate of transistor 420 at node 430. Switch 426 is connected to the output of inverter 448. Switch 428 is connected to the output of inverter 446. When the voltage level provided at the output 452 of the Schmitt trigger goes to a logical "high" level, switch 426 is opened and switch 428 is closed. Thus, in order for the Schmitt trigger output to go to the logical "low" level, the voltage at the input must drop below the VTHL level now connected to node 430. Similarly, when the voltage output level at node 452 goes to the logical "low" level, switch 428 is opened and switch 426 is closed to connect VTHH to node 430. Now, in order for the output at node 452 to go from the logical "low" to the logical "high" level, the input voltage at node 404 must exceed the VTHH threshold that is now connected to node 430. Transistor 420 has its drain/source path connected between node 432 and node 408. Transistor 434 has its source/drain path connected between the $V_{DD}$ node and node 432. The gate of transistor 434 is connected to its drain at node 432 and is also connected to the gate of transistor 436. The source/drain path of transistor 436 is connected between the $V_{DD}$ node and node 438. A current source 440 is connected between node 432 and ground. Transistor 442 has its drain/source path connected between node 438 and ground. The gate of transistor 442 is connected to the gate of a transistor 444. Transistor 444 has its drain/source path connected between node 416 and ground. The gate of transistor 444 in addition to being connected to transistor 442 is also connected to its drain at node 416. A series of inverters 446, 448 and 450 are connected in series between node 438 and the output node 452 of the Schmitt trigger. The input of inverter 446 is connected to node 438. The output of inverter 446 is connected to the input of inverter 448. The output of inverter 448 is connected to the input of inverter 450 and the output of inverter 450 is connected to output node 452.

To limit quiescent power dissipation, the amplifier with the differential pair input stage consisting of transistors 420 and 402 is biased with a relatively low quiescent current from current source 410. To minimize the delay with a high speed input signal, a dynamic biasing scheme and acceleration circuit as illustrated in FIG. 5 is utilized. During a high speed condition, the input signal has a relatively large slew rate. The dynamic current is selectively increased during rise and fall times of the input signal, i.e., on transitions and provides additional tail current and signal current from the differential input stage as described in FIG. 4. Therefore, signal delay from input to output is not much larger than the delay of four low voltage inverter stages. Note that the circuit in FIG. 5 consumes only several microamps quiescent current and remains inactive if the input signal is slow.

A more generalized version of this is illustrated in FIG. 5. The low value current source 410 as described with respect to FIG. 4 is complemented by an additional current source 502 that is selectively switched on to provide larger tail current at node 408. A current source 502 comprises a higher value current source that will more quickly enable the output of the Schmitt trigger to climb to a logical "high" level than the lower level value current source provided by current source 410. Current source 502 is only used in the time frame when a rising edge or a falling edge of the output pulse from the Schmitt trigger is being created. When the output of the Schmitt trigger is being maintained in a logical "low" level or a logical "high" level, current source 502 is reduced to a much smaller value and the tail current is maintained mainly using the current source 410. Selective use of the higher value current source 502 will enable the output of the Schmitt trigger to more quickly charge to the desired logical level using the higher value current source that consumes more power. However, during the states when the logical "high" level or logical "low" level are only being maintained, the lower value current source is utilized to conserve power within the circuitry.

Figure 6:
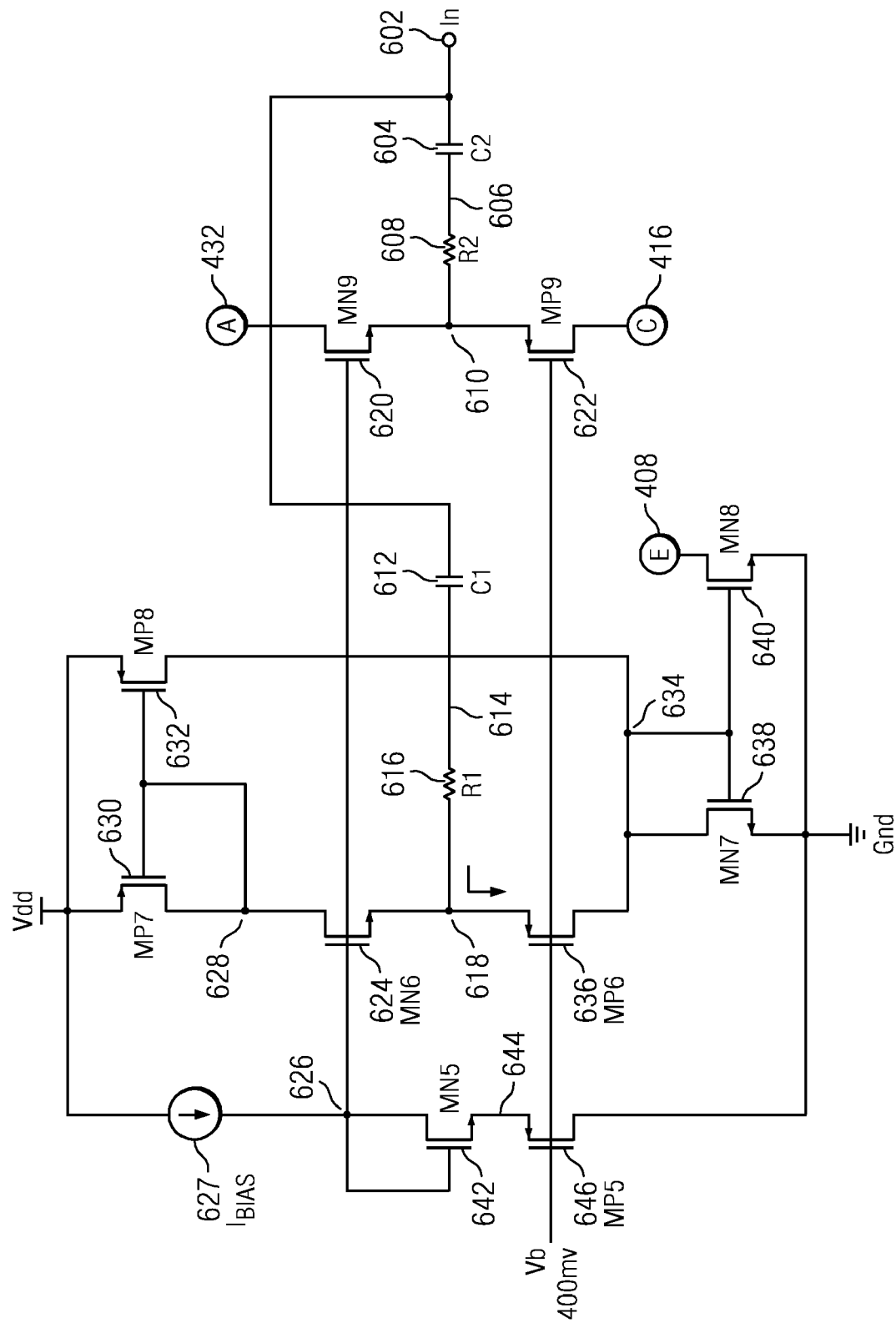
FIG. 6 is a schematic diagram illustrating the dynamic bias and acceleration circuit of the present disclosure.

Referring now to FIG. 6, there is illustrated a schematic diagram of the dynamic bias and acceleration circuitry that is utilized with the Schmitt trigger of FIG. 4 in order to accelerate a change in the output voltage responsive to changes in the input signal. The dynamic bias and acceleration circuit includes a second input at node 602 corresponding to node 404. The circuitry of FIG. 6 interconnects with the circuitry of FIG. 4 in the following manner. Node A connects with node 432 of FIG. 4. Node C connects with node 416 of the circuit of FIG. 4 and node E connects with node 408 of the circuit of FIG. 4. A capacitor 604 is connected between node 602 and a node 606. A resistor 608 is disposed in series with the capacitor 604 between node 606 and node 610. A capacitor 612 is connected between node 602 and a node 614. A resistor 616 is connected in series with capacitor 612 between node 614 and a node 618. A transistor 620 has its drain/source path connected between node 432 and node 610. A P-channel transistor 622 has its source/drain path connected between node 610 and node 416.

The gate of transistor 620 is connected to the gate of a transistor 624 at a node 626. The gate of transistor 622 is connected to an external bias voltage Vb. Transistor 624 is an N-channel transistor having its drain/source path connected between node 628 and node 618. A P-channel transistor 630 has its source/drain path connected between $V_{DD}$ and node 628. The gate of transistor 630 is connected to the gate of another P-channel transistor 632 and also to the drain of transistor 630 at node 628. The source/drain path of transistor 632 is connected between $V_{DD}$ and a node 634. A P-channel transistor 636 has its source/drain path connected between node 618 and a node 634. The gate of transistor 636 is connected to the bias voltage Vb. N-channel transistor 638 has its drain/source path connected between a node 634 and ground.

The gate of transistor 638 is connected to node 634 and to the gate of transistor 640. Transistor 640 is an N-channel transistor having its drain/source path connected between node 408 and ground and is the primary switching transistor for increasing current at transitions. A current source 627, providing $I_{BIAS}$, is connected between $V_{DD}$ and a node 626. An N-channel transistor 642 has its drain/source path connected between node 626 and a node 644. The gate of transistor 642 is connected to its drain at node 626. A P-channel transistor 646 is connected between node 644 and ground. The gate of transistor 646 is connected to the bias voltage Vb.

Figure 7:
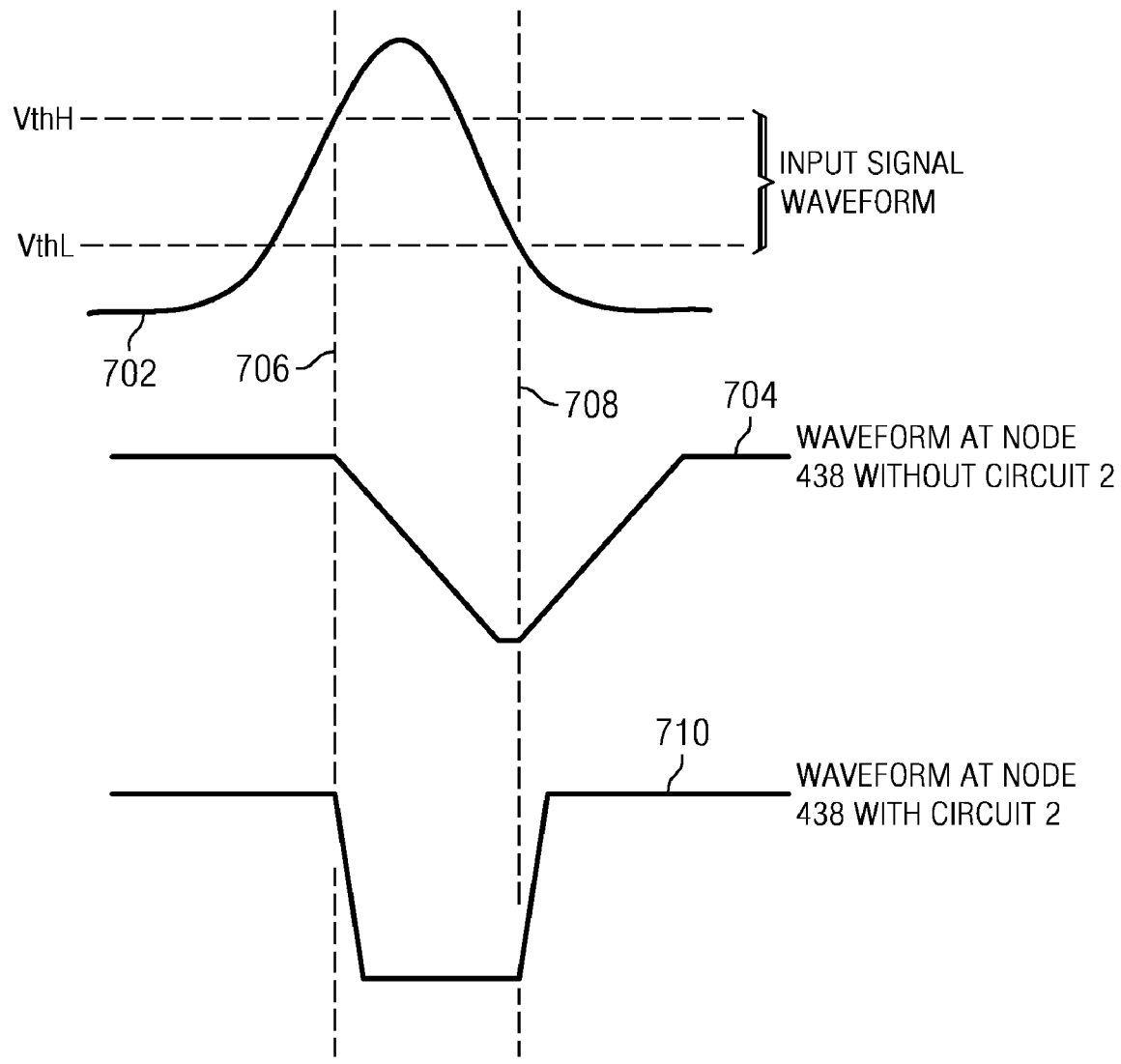
FIG. 7 illustrates the waveforms associated with the input and output of the Schmitt trigger using the circuitry of FIG. 6.

The circuit of FIG. 6 enables the bias current provided from node 408 to be increased during particular periods of time responsive to the input voltage. This is more fully illustrated in FIG. 7. The input voltage waveform 702 would cause the generation of the output waveform 704 when using only the $I_{SS}$ bias current of the circuit of FIG. 4. As can be seen, the output voltage provided solely by the circuit of FIG. 4 requires a substantial period of time for the voltage to increase from a logical "low" level to a logical "high" level. By switching on the current generated by the circuitry of FIG. 6 within times 706 and 708, the Schmitt trigger will generate an output waveform as illustrated generally at 710. The increased circuitry provided by the circuit of FIG. 6 causes the voltage level to go from a low voltage level to a high voltage level and a high voltage level to a low voltage level much more quickly than is enabled using only the $I_{SS}$ bias current of the circuit of FIG. 4. This is due to the fact that a higher current which more quickly moves the output voltage between the high and low voltage levels is utilized.

The circuitry of FIG. 6 in conjunction with the circuitry of FIG. 4 operates in the following manner. As noted herein above, the circuitry of FIG. 4 is basically a comparator with a differential amplifier input wherein the reference voltage is selected between two different threshold voltages depending upon the state of the output. The current source $I_{SS}$ 410 is a very small current and can actually be a "0" current. The circuitry of FIG. 6 through transistor 640 basically increases this current upon the detection of a transition and only for a short time therein. The static state of the circuit of FIG. 6 requires a small bias current that is provided by the current source to 627 that sources current to node 626. The bias voltage Vb is disposed at approximately 0.4 volts. This will maintain transistor 646 on and transistor 642, since it is diode connected, will also be on. Therefore, there will be a small bias current through this leg of current source 627, transistor 642 and transistor 646 thus biasing node 626. Since node 626 is biased, it will turn on transistor 624 and, in the static condition, transistor 636 will also be similar to transistor 646. This will cause a current to flow through transistor 630, transistor 624, transistor 636 and transistor 638. This will mirror the small bias current over to transistor 640 which will result in a small bias current from node 408 to ground. The current through this leg will be mirrored over to transistor 632 which will also provide a small current to node 634. In general, this is a very small current overall.

When a positive transition occurs, i.e., when the input voltage on node 602 goes from a low level to a high level, the voltage change on the plate of capacitor 612 connected thereto will cause node 614 to be "booted" up pulling node 618 high. When node 618 is pulled high, this will cause transistor 624 to turn off, and transistor 636 to turn on harder, and more current to be sourced to node 618 and subsequently to node 634. This increase in current through transistor 636 will be mirrored over to transistor 640, thus increasing the current from node 408 to ground. The amount of time that this increased current will exist will be determined by the value of capacitor 612 and resistor 616.

For a negative transition, the voltage at node 602 will go from a high voltage level to a low voltage level. What will happen is that capacitor 612 will boot node 618 low, turning off transistor 636. However, it will also turn transistor 624 harder drawing more current through transistor 630. This will mirror that additional current over to transistor 632 which will then deliver more current from $V_{DD}$ to node 634 and to transistor 638. This will be mirrored over to transistor 640, thus increasing the current from node 408 to ground.

To further accelerate the transition of a logic state to the inverter 446, transistors 620 and 622 are provided. The capacitor 604 is only a fraction of the value of capacitor 612 and the resistor 608 is larger than the value of resistor 616. In general, there will be a faster response time for node 610 being booted up or down. Similar to the description herein above, when the transition on node 602 goes high, it will boot node 610 high. This will turn off transistor 620 and cause transistor 622 to turn on harder and source current from the node 606 and the plate of the capacitor associated therewith. This will cause more current to go into node 416. Since more current is driven to transistor 444, this will cause the gate of transistor 442 to go higher and start to, or assist in turning on transistor 442. This will begin the pull down of node 438 at an accelerated rate and enhance the change in the logic level from a high to a low faster than associated with the current being pulled down from node 408. This will thus slightly accelerate the change of logic state. In the opposite state, when the voltage goes from a logic state to a low logic state, voltage 610 is pulled low, turning off transistor 622 but turning on transistor 620 to pull additional current from node 432. When this occurs, that additional current is mirrored over to node 438 and the current sourced through transistor 436. This will cause node 438 to rise further accelerating the change of logic state from a logic "low" to a logic "high."

It will be appreciated by those skilled in the art having the benefit of this disclosure that this Schmitt trigger with gated transition level control provides an improved high and low power mode of operation. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A Schmitt trigger, comprising:
    first circuitry for receiving an input voltage and providing an output voltage at either a logical low voltage level or a logical high voltage level responsive to the input voltage and a first bias current;
    second circuitry connected to the first circuitry for generating a second bias current for generating the output voltage, wherein the second bias current is larger than the first bias current; and
    wherein the Schmitt trigger operates a low power mode of operation using only the first bias current to maintain the logical low voltage level or the logical high voltage level at a substantially constant level and the Schmitt trigger operates a high power mode of operation using the second bias current during transition periods between the logical low voltage level and the logical high voltage level.

2. The Schmitt trigger of claim 1, wherein the second circuitry generates the second bias current responsive to transitioning of the input voltage between logical "high" and logical "low" levels.

3. The Schmitt trigger of claim 1, wherein the Schmitt trigger operates in the high power mode of operation using both the first bias current and the second bias current during transition periods between logical low level and the logical high level.

4. The Schmitt trigger of claim 1, wherein the Schmitt trigger operates in the low power mode of operation using only the first bias current outside of transition periods between logical low voltage level and the logical high voltage level.

5. The Schmitt trigger of claim 1, wherein the first circuitry further comprises:
    a bandgap generator for generating a high threshold voltage and a low threshold voltage;
    wherein the first circuitry further transitions between the logical high voltage level and the logical low voltage level responsive to the input voltage, the first bias current and a selected one of the high threshold voltage and the low threshold voltage.

6. The Schmitt trigger of claim 1, wherein the first circuitry further comprises a differential amplifier, the input voltage applied to a first input of the differential amplifier and a selected one of a high threshold voltage and a low threshold voltage applied to a second input of the differential amplifier.

7. The Schmitt trigger of claim 6, wherein the high threshold voltage is selected responsive to the logical low voltage level at an output of the Schmitt trigger and the low threshold voltage is selected responsive to the logical high voltage level at the output of the Schmitt trigger.

8. The Schmitt trigger of claim 6 further comprising:
    a first switch for connecting the high threshold bias voltage to the second input of the differential amplifier responsive to an output of the Schmitt trigger; and
    a second switch for connecting the low threshold bias voltage to the second input of the differential amplifier responsive to the output of the Schmitt trigger.

9. A digital circuit, comprising:
    a plurality of digital inputs for receiving an input voltage;
    a Schmitt trigger connected to at least one of the plurality of digital inputs, the Schmitt trigger further comprising:
    first circuitry for receiving the input voltage and providing an output voltage at either a logical low voltage lever or a logical high voltage level responsive to the input voltage and a first bias current;
    second circuitry connected to the first circuitry for generating a second bias current for generating the output voltage, wherein the second bias current is larger than the first bias current during fast transition of the input voltage; and
    wherein the Schmitt trigger operates a low power mode of operation using only the first bias current to maintain the logical low voltage level or the logical high voltage level at a substantially constant level and the Schmitt trigger operates a high power mode of operation using the second bias current during transition periods between the logical low voltage level and the logical high voltage level.

10. The digital circuit of claim 9, wherein the second circuitry generates the second bias current responsive to transitioning of the input voltage between logical "high" and logical "low" levels.

11. The digital circuit of claim 9, wherein the Schmitt trigger operates in the high power mode of operation using both the first bias current and the second bias current during transition periods between logical low level and the logical high level.

12. The digital circuit of claim 9, wherein the Schmitt trigger operates in the low power mode of operation using only the first bias current outside of transition periods between logical low voltage level and the logical high voltage level.

13. The digital circuit of claim 9, wherein the first circuitry further comprises:
   a bandgap generator for generating a high threshold voltage and a low threshold voltage;
   wherein the first circuitry further transitions between the logical high voltage level and the logical low voltage level responsive to the input voltage, the first bias current and a selected one of the high threshold voltage and the low threshold voltage.

14. The digital circuit of claim 9, wherein the first circuitry further comprises a differential amplifier, the input voltage applied to a first input of the differential amplifier and a selected one of a high threshold voltage and a low threshold voltage applied to a second input of the differential amplifier.

15. The digital circuit of claim 14, wherein the high threshold voltage is selected responsive to the logical low voltage level at an output of the Schmitt trigger and the low threshold voltage is selected responsive to the logical high voltage level at the output of the Schmitt trigger.

16. The digital circuit of claim 14 further comprising:
   a first switch for connecting the high threshold bias voltage to the second input of the differential amplifier responsive to an output of the Schmitt trigger; and
   a second switch for connecting the low threshold bias voltage to the second input of the differential amplifier responsive to the output of the Schmitt trigger.

17. A method for generating an output from a Schmitt trigger, comprising the steps of:
   receiving an input voltage;
   providing an output voltage from the Schmitt trigger in a low power mode of operation using only a first bias current to maintain the logical low voltage level or the logical high voltage level at a substantially constant level;
   generating a second bias current for generating the output voltage, wherein the second bias current is larger than the first bias current;
   providing an output voltage from the Schmitt trigger in a high power mode of operation using the second bias current during transition periods between the logical low voltage level and the logical high voltage level.

18. The method of claim 17, wherein the step of generating the second bias current further includes the step of generating the second bias current responsive to the input voltage transitioning between a first level and a second level.

19. The method of claim 17, wherein the step of providing in the high power mode further comprises the step of providing an output voltage from the Schmitt trigger in the high power mode of operation using both the first bias current and the second bias current during transition periods between the logical low voltage level and the logical high voltage level.

20. The method of claim 17, wherein the step of providing is in the low power mode further comprises the step of providing an output voltage from the Schmitt trigger in the high power mode of operation using both the first bias current outside of transition periods between logical low voltage level and the logical high voltage level.

21. The method of claim 17, wherein the step of providing further comprises the steps of:
   generating a high threshold voltage and a low threshold bias voltage;
   selecting one of the high threshold voltage and the low threshold voltage; and
   transitioning between the logical high voltage level and the logical low voltage level responsive to the input voltage, the first bias current and the selected one of the high threshold voltage and the low threshold voltage.

22. The method of claim 21, wherein the step of selecting further comprises the steps of:
   selecting the high threshold voltage responsive to the logical low voltage level at an output of the Schmitt trigger; and
   selecting the low threshold voltage responsive to the logical high voltage level at the output of the Schmitt trigger.

* * * * *